(12) United States Patent
Kinoshita

(10) Patent No.: US 7,157,836 B2
(45) Date of Patent: Jan. 2, 2007

(54) PIEZOELECTRIC DEVICE

(75) Inventor: Yusuke Kinoshita, Minowa-machi (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 11/252,983

(22) Filed: Oct. 18, 2005

(65) Prior Publication Data

US 2006/0082260 A1    Apr. 20, 2006

(30) Foreign Application Priority Data

Oct. 19, 2004    (JP)    ............................ 2004-304802

(51) Int. Cl.
*H01L 41/08*    (2006.01)
*H01L 41/053*    (2006.01)

(52) U.S. Cl. ...................... 310/348; 310/344
(58) Field of Classification Search .............. 310/348, 310/370, 344
See application file for complete search history.

(56) References Cited

U.S. PATENT DOCUMENTS 6,545,392 B1 *    4/2003    Kawauchi et al. .......... 310/344

6,806,797 B1 *   10/2004    Kikushima ................. 333/200
2004/0160145 A1    8/2004    Takeuchi .................... 310/348

FOREIGN PATENT DOCUMENTS

| JP | 2002-009577 A | | 1/2002 |
| JP | 2004-138390 A | | 5/2004 |
| JP | 2004-153408 | | 5/2004 |
| JP | 2004153408 A | * | 5/2004 |
| JP | 2004-226181 | | 8/2004 |
| JP | 2004-274263 A | | 9/2004 |

OTHER PUBLICATIONS

International Search Report regarding corresponding PCT application.

* cited by examiner

*Primary Examiner*—Darren Schuberg
*Assistant Examiner*—J. Aguirrechea
(74) *Attorney, Agent, or Firm*—Harness, Dickey & Pierce, P.L.C.

(57) ABSTRACT

A piezoelectric device including an IC chip mounted on an inner bottom surface of a package, and a piezoelectric vibrating reed electrically and mechanically connected onto a TAB tape in which a lead is provided on a surface of a resin tape. The TAB tape to which the piezoelectric vibrating reed has been joined is mounted in the package, whereby the piezoelectric vibrating reed is arranged above the IC chip.

4 Claims, 9 Drawing Sheets

PIEZOELECTRIC DEVICE

TECHNICAL FIELD

The present invention relates to a piezoelectric device, and particularly to a piezoelectric device provided with a piezoelectric vibrating reed and an IC chip that are mounted on a TAB tape.

BACKGROUND ART

As piezoelectric devices go, there are a gyro sensor for detecting an angular velocity, a piezoelectric vibrator and a piezoelectric oscillator that output a desired oscillation frequency, and a filter that selects a desired frequency band. A piezoelectric oscillator includes a package base having a recess portion therein. Onto this recess portion, a TAB tape is mounted, in which a wiring pattern to which an IC chip and a piezoelectric vibrating reed are connected is provided on the surface of an insulation tape. This TAB tape is constructed so that a window portion is provided for the insulation tape. A part of the wiring pattern is bent upward through this window portion. Further, on the lower surface of the TAB tape, the IC chip is mounted. The piezoelectric vibrating reed is mounted on the upward bent portion of the wiring pattern. Further, to the upper surface of the package base, a lid is joined, whereby the recess portion is air-tightly sealed (refer to, for example, FIG. 12 in Patent Document JP-A-2004-153408).

Further, if the piezoelectric device is a gyro sensor, the piezoelectric vibrating reed of the gyro sensor is H-shaped in plane. A base portion (mount portion) connected to a support body is provided in the center portion of the piezoelectric vibrating reed. From one end of this base portion, a pair of drive arms are protruded, and from the other end of the base portion opposed to the one end, a pair of detecting arms are protruded. For the drive arm, a drive electrode is provided, and for the detection arm, a detection electrode is provided. The drive electrode and detection electrode conduct to an electrode pad provided for the base portion (refer to, for example, Patent Document JP-A-2004-226181).

FIG. 8 is an explanatory view when the piezoelectric vibrating reed and the IC chip are mounted on the TAB tape. If a piezoelectric vibrating reed 1 having the mounted portion in its center portion is mounted on a TAB tape 2 through a bump, the TAB tape 2 must have a window portion 3 as disclosed in Patent Document JP-A-2004-153408 in the center portion of the TAB tape 2. If an IC chip 4 is mounted on this TAB tape 2, it cannot be mounted under the piezoelectric vibrating reed 1 because the window portion 3 is provided. Therefore, the TAB tape 2 is extended to the side, and the IC chip 4 is mounted on this extended portion. However, when an electronic apparatus on which the piezoelectric device is mounted is minaturized, it is necessary to reduce the thickness and the plane size of the piezoelectric device. Therefore, the plane size of the piezoelectric device becomes large and the miniaturization cannot be achieved, so that the mounted space of the piezoelectric device becomes large.

Further, if the gyro sensor in which the piezoelectric vibrating reed is mounted on the TAB tape, there is a possibility that the wiring pattern of the TAB tape and the base plate thereof resonate due to a bending vibration of the piezoelectric vibrating reed. Therefore, the TAB tape is designed so that resonation is not produced. Though a resonation design may be obtained by calculation, the calculation becomes very complicated if the IC chip is mounted on the TAB tape. As such, the accuracy of the calculation is lowered. Therefore, the wiring pattern and the base plate resonate due to the bending vibration of the piezoelectric vibrating reed.

Further, in the piezoelectric device, its package inside is air-tightly sealed in an atmosphere of a vacuum or an inert gas. As an airtight sealing method, a lid may be joined onto the upper surface of a package base having a seal hole on the bottom surface. Thereafter, the seal hole may be melt-sealed with a sealant while putting the package in a vacuum. FIG. 9 is an explanatory view of the seal hole provided in the package base. FIG. 9(a) is a schematic plan view showing the seal hole provided in the package base and a mount electrode, and FIG. 9(b) is a schematic side view. An external electrode 6 is provided on a rear surface of the package base 5, and a mount electrode 7 for mounting a TAB tape, and a piezoelectric vibrating reed, an IC chip, and a circuit pattern are formed on an inner bottom surface of the package base. Further, a seal hole 8 penetrates the package base 5 linearly, so that the package outside can be confirmed visually from the package inside. Therefore, the position of the seal hole 8 in the package base 5 is limited by the position of the external electrode 6 and strength of the package. Therefore, the seal hole 8 can be provided near the mount electrode 7. However, if a conductive adhesive is applied onto the mount electrode 7 and the TAB tape is mounted on the mount electrode 7, the conductive adhesive frequently flows out from the mount electrode 7 and flows into the seal hole 8. As a result, the conductive adhesive can flow through the seal hole 8 to the rear surface of the package base 5, which obstructs the joint between the sealant 9 and the package base 5 when the seal hole 8 is melt-sealed with the sealant 9.

In view of the above, it is desirable to provide a piezoelectric device in which miniaturization of its plane size is possible and the resonance design of a TAB tape is readily performed. Further, it is desirable to provide a piezoelectric device which can surely seal a seal hole.

SUMMARY OF THE INVENTION

A piezoelectric device according to the invention is characterized in that an IC chip is mounted on an inner bottom surface of a package, and a piezoelectric vibrating reed is electrically and mechanically connected onto a TAB tape in which a lead is provided on a surface of a resin tape. The TAB tape to which the piezoelectric vibrating reed has been joined is mounted in the package, whereby the piezoelectric vibrating reed is arranged above the IC chip. In this case, the IC chip includes at least a circuit for driving the piezoelectric vibrating reed, and a circuit for detecting a signal outputted from the piezoelectric vibrating reed. Since the piezoelectric vibrating reed can be arranged above the IC chip, the plane size of the piezoelectric device can be miniaturized. Therefore, the space where the piezoelectric device is mounted on a mounting substrate can be reduced.

Further, the piezoelectric device is characterized in that the TAB tape has a device hole in its center, and the lead is protruded inward of the device hole. The leading end portion of the lead and a connection electrode provided for the piezoelectric vibrating reed are electrically and mechanically connected. Even if the device hole is provided in the center portion of the TAB tape, because the IC chip is mounted on the inner bottom surface of the package, the piezoelectric vibrating reed can be arranged above the IC chip so that the plane size of the piezoelectric device can be miniaturized. Further, since the TAB tape is joined to the piezoelectric vibrating reed, the elements for calculation can be reduced when the resonance design of the TAB tape is performed. As such, the resonance design can be performed exactly.

Further, the piezoelectric device is characterized in that the piezoelectric vibrating reed has in its center a base portion on which the connection electrode is formed. A drive arm and a detection arm for detecting an angular velocity are protruded from the base portion. Hereby, the piezoelectric device can be function as a gyro sensor that detects the angular velocity. Further, even if the piezoelectric vibrating reed has the base portion in its center, the piezoelectric vibrating reed can be mounted in the center of the TAB tape. Therefore, the plane size of the piezoelectric device can be miniaturized.

Further, the piezoelectric device is characterized in that a seal hole through which the inside of the package is airtightly sealed is provided at the bottom of the package, and the seal hole has a bending portion. If an adhesive flows out from a mount electrode and flows in the seal hole, the adhesive flows out along the side surface of the seal hole. However, due to the bending portion provided for the seal hole, it is possible to prevent the adhesive from flowing to the rear surface of the package. Further, even if a sealant arranged in the seal hole melts, due to the bending portion, it is possible to prevent the sealant from flowing in the inside area of the package where the IC chip or the TAB tape is arranged.

Further, the piezoelectric device is characterized in that the seal hole includes an outer seal hole located on the outside of the package in relation to the bending portion, and an inner seal hole located on the inside of the package in relation to the bending portion. The outer seal hole and the inner seal hole are separate in the horizontal direction. Since the outer seal hole and the inner seal hole are separate in the horizontal direction, it is possible to prevent the adhesive flowing out from the inner hole from directly dropping in the outer hole. Further, due to the bending portion, the outflow of the adhesive can be prevented. Further, even if a sealant arranged in the seal hole melts, due to the bending portion, it is possible to prevent the sealant from flowing in the inside area of the package where the IC chip or the TAB tape is arranged.

DETAILED DESCRIPTION OF THE PREFERRED EMBODIMENTS

Figure 1A:
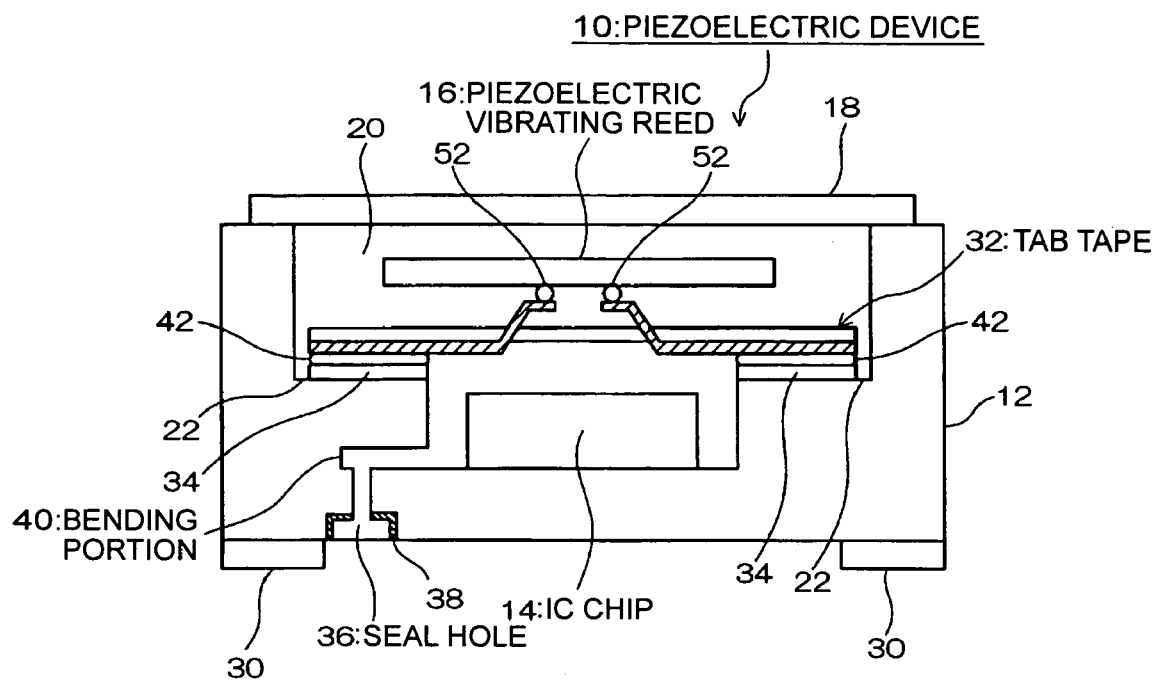
FIG. 1 is an explanatory view of a piezoelectric device.
Figure 1B:
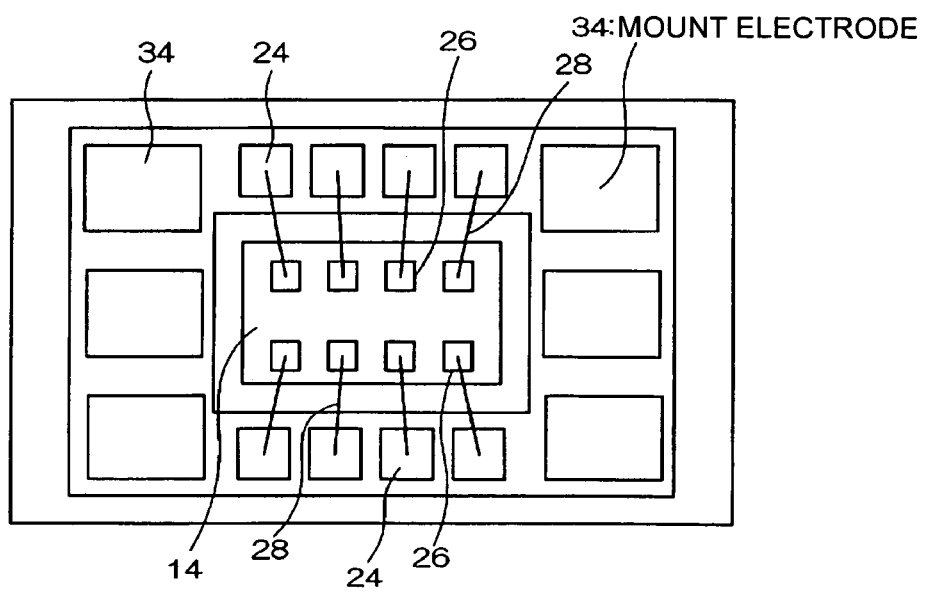
Figure 2A:
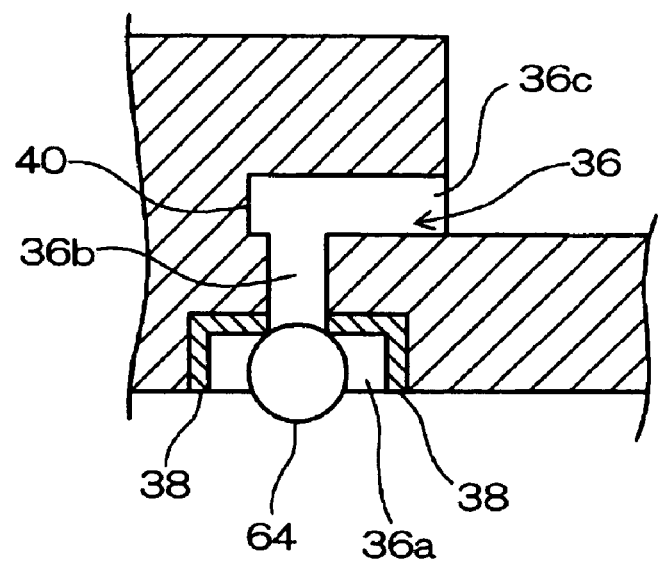
FIG. 2 is an explanatory view of a seal hole.
Figure 2B:
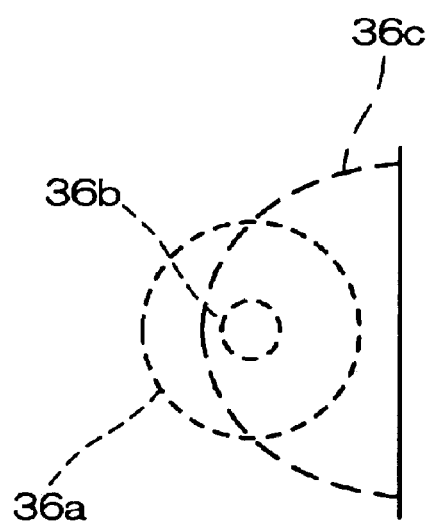
Figure 3A:
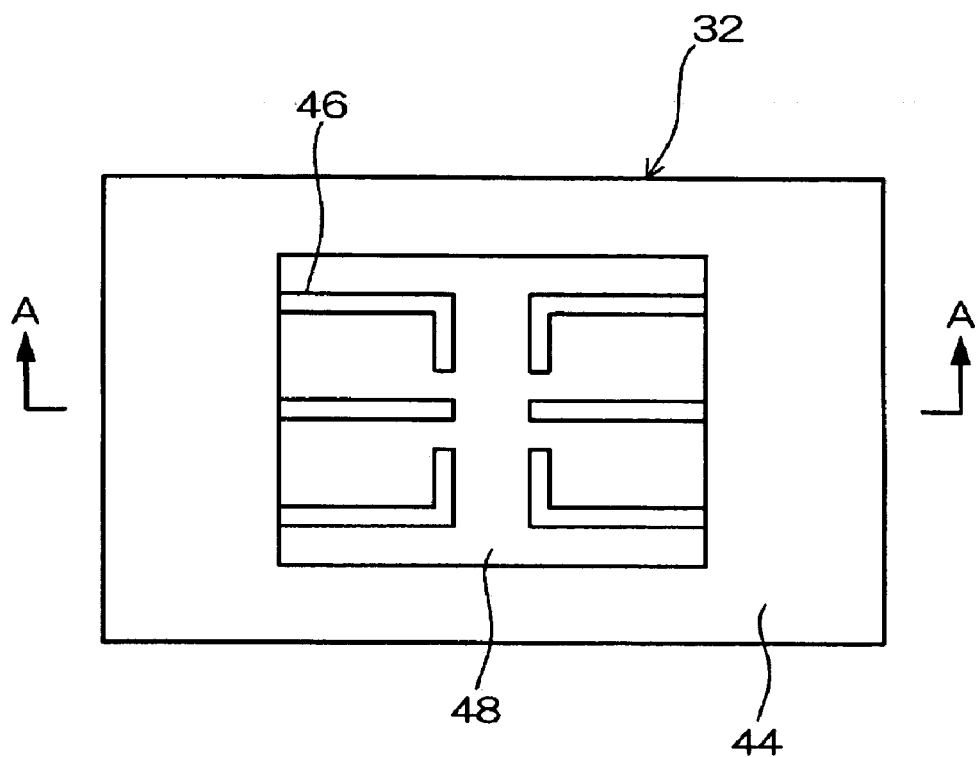
FIG. 3 is an explanatory view of a TAB tape.
Figure 3B:
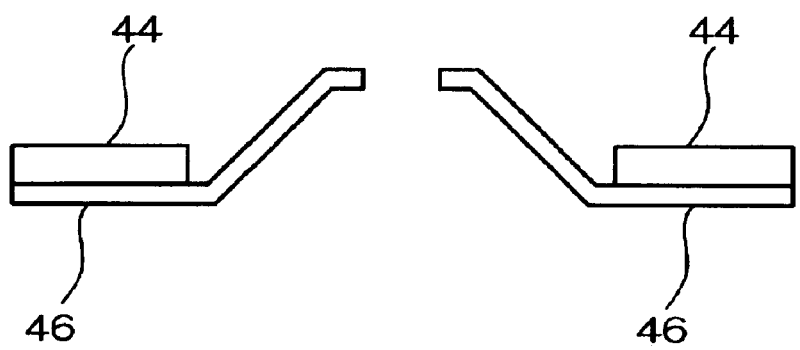
Figure 4:
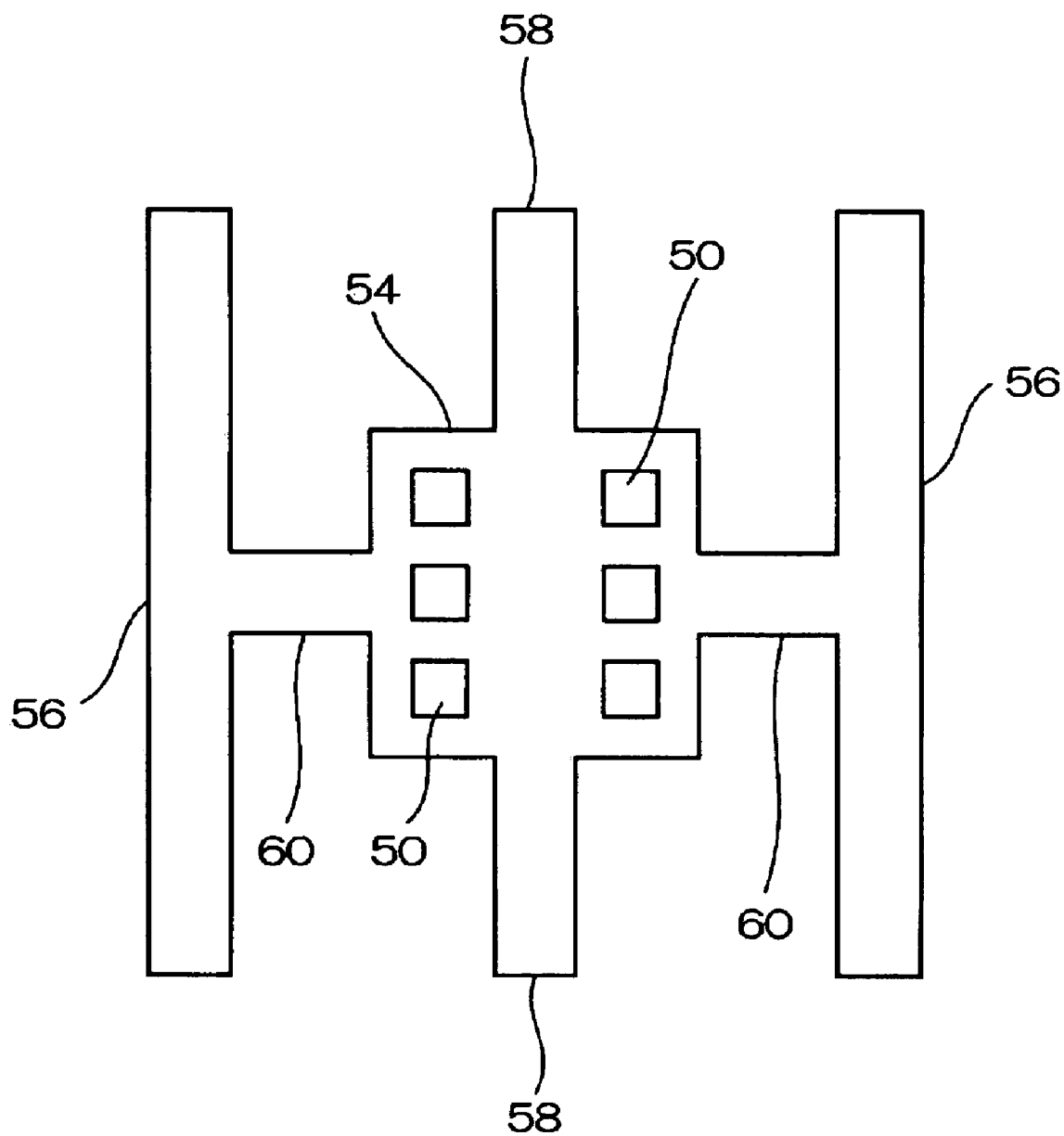
FIG. 4 is an explanatory view of a piezoelectric vibrating reed.

A piezoelectric device according to the present invention will now be described below. FIG. 1 is an explanatory view of a piezoelectric device, in which FIG. 1(a) is a schematic sectional view, and FIG. 1(b) is a schematic plan view in which a lid and a TAB tape are removed. FIG. 2 is an explanatory view of a seal hole, in which FIG. 2(a) is a schematic sectional view, and FIG. 2(b) is a schematic plan view. FIG. 3 is an explanatory view of the TAB tape, in which FIG. 3(a) is a schematic plan view, and FIG. 3(b) is a sectional view taken along a line A—A of FIG. 3(a). FIG. 4 is an explanatory view of a piezoelectric vibrating reed. In the piezoelectric device 10, an integrated circuit (IC) chip 14 is mounted on an inner bottom surface of a package base 12, a TAB tape 32 is mounted to which a piezoelectric vibrating reed 16 is electrically and mechanically connected, the piezoelectric vibrating reed 16 is arranged above the IC chip 14, and a lid 18 is joined onto an upper surface of the package base 12.

The package base 12 has a recess portion 20 therein, and is formed by laminating a plane sheet and a frame sheet that are made of, for example, a ceramic. A side surface of the recess portion 20 is formed in the shape of a staircase. Onto a bottom surface of the recess portion 20, the IC chip 14 that drives the piezoelectric vibrating reed 16 and detects a signal outputted from the piezoelectric vibrating reed 16 is mounted.

Further, on the upper surface of a staircase portion 22 of the recess portion 20, a pad electrode 24 is provided. This pad electrode 24 and a pad 26 provided for the IC chip 14 are electrically connected through a wire 28, whereby the pad electrode 24 and the IC chip 14 are electrically connected. A part of this pad electrode 24 is electrically connected to an external electrode 30 provided on the rear surface of the package base 12. Further, on the upper surface of the stair portion 22, a mount electrode 34 for mounting the TAB tape 32 is provided. This mount electrode 34 is electrically connected to the pad electrode 24 thereby to be electrically connected to the IC chip 14. The mount electrode 34 may be formed by a metallize-printing metal such as tungsten on the package base 12, and thereafter performing nickel plating and gold plating. The nickel plating is performed in order to increase an attachment strength between the metallized pattern and gold. Other metal plating known to one of skill in the art may be used as long as it has this function.

Further, in the package base 12, a seal hole 36 (36a, 36b, 36c) is provided which penetrates the package base 12 from the recess portion 20 to the rear surface of the package base 12, and is used for airtight sealing in the package. This seal hole 36 is formed so that its diameter is different between the rear surface side and the inner side of the package base 12. That is, so that the hole diameter on the rear surface side of the package base 12 is larger than the hole diameter on the inner side thereof. Further, a metallization 38 is applied onto an inner wall of a seal hole 36a on the rear surface side of the package base 12. Further, the seal hole 36 includes a bending portion 40. This bending portion 40 bends horizontally from seal holes 36a and 36b and extends from the rear surface of the package base 12 upward, and causes a seal hole 36c to open to a side surface of the recess portion 20. The seal hole 36 can be formed as follows. Namely, if package base 12 is formed by laminating a plurality of plane sheets and frame sheets that are made of ceramics or the like, the bottom surface of the package base 12 is formed by laminating two plane sheets, and the frame sheet is laminated on this bottom surface. At this time, in the two plane sheets, holes should be provided so that their center positions are the same, and the diameter of the hole provided in the plane sheet on the rear surface side of the package base 12 becomes larger than that of the hole provided in the plane sheet on the inner side of the package base 12. Further, in the frame sheet, a notch that extends from the frame inner wall that becomes the side surface of the recess portion 20 to the outer wall should be provided, and this notch can have a depth by which the holes provided in the plane sheets are opened. Further, the shapes of the hole and the notch are not limited to the shapes shown in FIG. 2, but they may be quadrilateral or ellipsoidal.

On the mount electrode 34, the TAB tape 32 is mounted using a conductive adhesive 42. This TAB tape 32 is substantially rectangular, and formed by joining a lead 46 formed of copper foil onto the surface of an insulating tape 44 formed of polyimide resin or the like. Further, the TAB tape 32 has a device hole 48 in its center. This device hole 48 has a size such that a bonding tool for bonding the piezoelectric vibrating reed 16 onto the lead 46 can pass through, and the plurality of leads 46 are protruded from the peripheral edge of the device hole 48 to the inside of the device hole 48. The leads 46 are provided according to the number of connection terminals 50 provided for the piezoelectric vibrating reed 16, and extended from the position corresponding to the mount electrode 34 to the inside of the device hole 48. Further, the lead 46 provided protrusively for the device hole 48 is bent through the device hole 48 toward the insulating tape 44 side.

To a leading end of this lead 46, the piezoelectric vibrating reed 16 is joined, using a bump 52. The piezoelectric vibrating reed 16 has a rectangular base portion 54 in its center, and a drive arm 56 and a detection arm 58 for detecting an angular velocity are protruded from this base portion 54. Specifically, the piezoelectric vibrating reed 16 has a support portion 60 that protrudes from the nearly center portion of left and right sides of the base portion 54 in the left and right directions, and the drive arm 56 protrudes, in the both directions (in the up-and-down direction in FIG. 4) orthogonal to the direction along the support portion 60, from the leading portion of each support portion 60. Further, from the nearly center portion of upper and lower sides of the base portion 54, the detection arm 58 protrudes in parallel to the drive arm 56 (in the upward and downward directions in FIG. 4). The drive arm 56 may be provided with a drive electrode (not shown), the detection arm 58 may be provided with a detection electrode (not shown), and the drive electrode and the detection electrode conduct to a connection electrode 50. This connection electrode 50 provided for the base portion 54 is electrically and mechanically connected to the lead 46.

Onto the upper surface of the package base 12, the lid 18 is joined. Hereby, the piezoelectric device 10 includes the piezoelectric vibrating reed 16 and the IC chip 14 in the package.

Such a piezoelectric device 10 is used as a gyro sensor. Operation of the gyro sensor is as follows. Namely, when the drive arm 56 of the piezoelectric vibrating reed 16 receives a drive voltage from the IC chip 14, its leading end vibrates to the left and right (in the left and right directions in FIG. 4). At this time, when the angular velocity of rotation acts around a center of the base portion 54, a Coriolis force acts in the direction along the drive arm 56. The above vibration is transmitted through the support portion 60 and the base portion 54 to the detection arm 58, so that the detection arm 58 vibrates to the left and right (in the left and right directions in FIG. 4). An electric field on the basis of the vibration of the detection arm 58 is taken as a signal. In this manner, the angular velocity of rotation is detected.

Next, a manufacturing method of the piezoelectric device 10 will be described. Firstly, on the recess portion 20 bottom surface of the package base 12, the IC chip 14 is mounted using an adhesive or the like. At this time, the IC chip 14 is mounted with its active surface facing upward, and a pad 26 provided on the active surface and the pad electrode 24 provided for the package base 12 are wire-bonded. Further, the IC chip 14 may be mounted facedown.

Figure 5A:
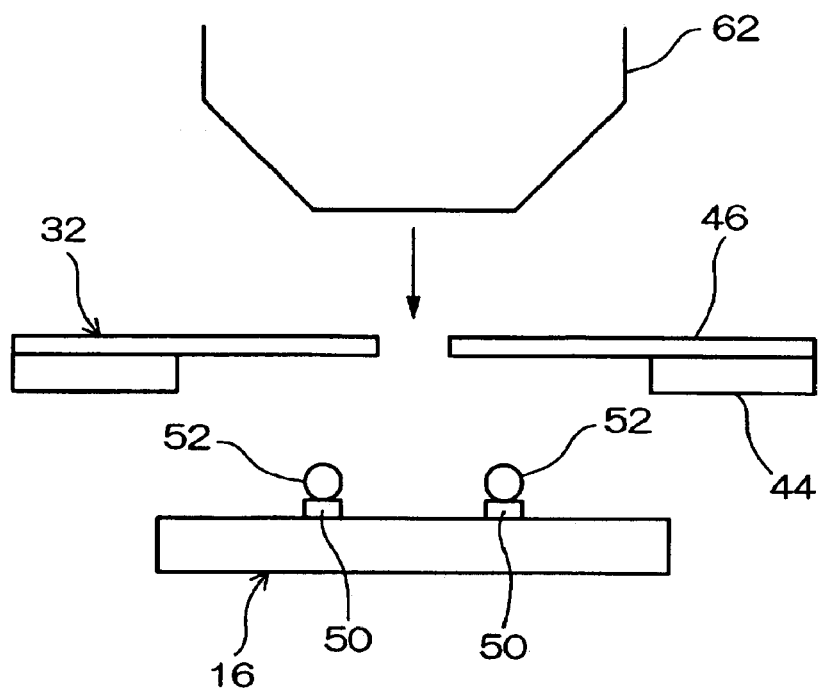
FIG. 5 is a process drawing when the piezoelectric vibrating reed is joined onto the TAB tape.
Figure 5B:
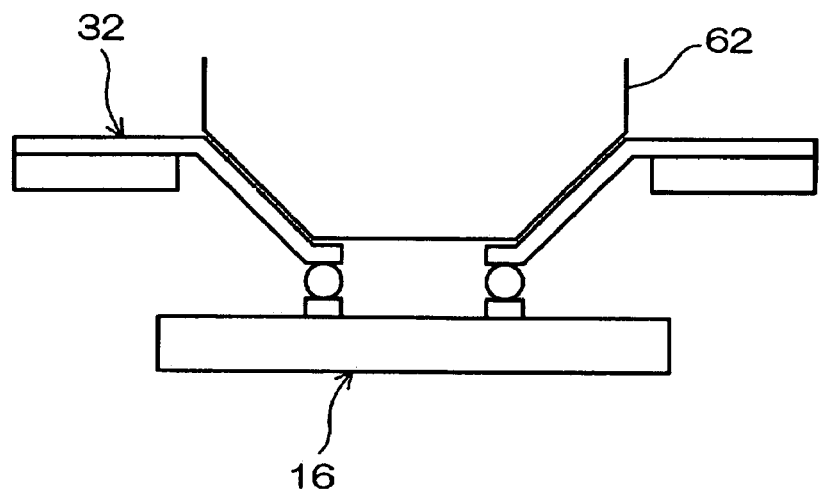

Further, the piezoelectric vibrating reed 16 is joined onto the TAB tape 32. FIG. 5 is a process showinging when the piezoelectric vibrating reed 16 is joined onto the TAB tape 32. Specifically, the bump 52 is first provided on the connection electrode 50 of the piezoelectric vibrating reed 16. The piezoelectric vibrating reed 16 is arranged facing the connection electrode 50 upward, and the TAB tape 32 is arranged above the piezoelectric vibrating reed 16. At this time, the TAB tape 32 is arranged so that the connection electrode 50 of the piezoelectric vibrating reed 16 and the leading end of the TAB tape 32 are superimposed on each other. Next, above the device hole 48 of the TAB tape 32, the bonding tool 62 is arranged (refer to FIG. 5(*a*)). Thereafter, the bonding tool 62 is caused to descend, whereby the lead 46 of the TAB tape 32 is bent by the bonding tool 62, and the leading end of the lead 46 is joined to the connection electrode 50 of the piezoelectric vibrating reed 16 (refer to FIG. 5(*b*)). At this time, if the lead 46 is joined to the piezoelectric vibrating reed 16 by heat-press bonding, the joint portion is heated and the leading end of the lead 46 should be pressed on the bump 52 by the bonding tool 62. Further, in case that the lead 46 is joined to the piezoelectric vibrating reed 16 by ultrasonic vibration, when the leading end of the lead 46 is pressed on the bump 52 by the bonding tool 62, the ultrasonic vibration should be applied to the bonding tool 62 thereby to join an interface between the lead 46 and the bump 52.

Thereafter, on the package base 12 on which the IC chip 14 has been mounted, the TAB tape 32 to which the piezoelectric vibrating reed 16 has been joined is mounted. At this time, onto the mount electrode 34, by use of the conductive adhesive 42 such as silver paste, the lead 46 of the TAB tape 32 is joined. Hereby, the piezoelectric vibrating reed 16 and the IC chip 14 are electrically connected.

Next, onto the upper surface of the package base 12, the lid 18 for sealing the recess portion 20 of the package base 12 is joined. If the lid 18 is made of, for example, metal, the lid may be joined onto the package base 12 by seam welding or the like.

Thereafter, the seal hole 36 provided on the bottom surface of the package base 12 is air-tightly sealed by a sealant 64. This sealant 64 is a metal ball formed of a gold-tin soldered material or a lead-tin soldered material. Further, as the material of the sealant 64, other materials than the above material may be used, for example, a Sn soldered material, a silver-copper alloy, or a brazing filler metal. Further, the shape of the sealant 64 may be other shapes than the above shape, for example, a disk.

Further, hole-sealing is specifically performed as follows. Firstly, the piezoelectric device 10 before hole-sealing is laid in a vacuum, and the sealant 64 is set in the opening portion of the seal hole 36 (refer to FIG. 2(*a*)). Since the diameter of the seal hole 36*a* on the rear surface side of the package base 12 is larger than the diameter of the inner seal hole 36*b*, when the sealant 64 is set in the seal hole 36*a* on the rear surface side of the package base 12, it is possible to prevent the sealant 64 from moving by the side surface of the seal hole 36*a* on the rear surface side of the package base 12. Thereafter, the sealant 64 is irradiated with an electronic beam or a laser beam, or brought into contact with a heating device, to thereby melt the sealant 64. The melted sealant 64 is attached to the metallization 38, whereby the seal hole 36 is sealed. Therefore, the recess portion 20 is vacuum-sealed.

Thereafter, a probe is brought into contact with the external electrode 30 and the like, and data such as an amplification factor for controlling detection sensitivity of the piezoelectric vibrating reed 16 is written into the IC chip 14. After a characteristic test, the piezoelectric device 10 is forwarded as a gyro sensor.

In the construction of such a piezoelectric device 10, since the IC chip 14 is mounted on the recess portion 20 bottom surface of the package base 12, and the TAB tape 32 is mounted on the upper surface of the staircase portion 22 in the recess portion 20, the piezoelectric vibrating reed 16 is arranged above the IC chip 14. Therefore, even when the connection electrode 50 is formed in the center portion of the piezoelectric vibrating reed 16, and this connection electrode 50 and the reed 46 of the TAB tape 32 are electrically and mechanically connected, the plane size of the piezoelectric device 10 can be miniaturized. As a result, the mounted space where the piezoelectric device 10 is mounted on the mounting substrate can be reduced.

Further, in the piezoelectric device 10, since the IC chip 14 is not mounted on the TAB tape 32, the number of elements for calculation when the resonance design of the TAB tape 32 is performed can be reduced so that the resonance design can be performed exactly. Therefore, the piezoelectric device 10 of high accuracy can be obtained.

Further, because the IC chip 14 is mounted on the package base 12, the strength of the TAB tape 32 is increased. Therefore, the piezoelectric device 10 of high reliability can be obtained. In contrast, if the IC chip was mounted on the TAB tape, the mass added to the TAB tape would become large which would reduce the strength of the TAB tape.

Further, since the seal hole 36 provided for the package base 12 has the bending portion 40, even if the conductive adhesive 42 applied on the mount electrode 34 flows out when the TAB tape 32 is joined onto the mount electrode 34, the outflow of the conductive adhesive 42 can be inhibited by the bending portion 40. Namely, the conductive adhesive 42 does not flow out from the bending portion 40 to the rear surface side of the package base 12. Therefore, the mount electrode 34 and the metallization 38 applied onto the seal hole 36 do not short. Further, since the metallization 38 is not covered with the conductive adhesive 42 that has flowed out, the seal hole 36 can be surely sealed by the sealant 64. Hereby, the piezoelectric deice 10 of high reliability can be obtained.

Further, when the sealant 64 melts, it is possible to prevent, due to the bending portion 40, the sealant from flowing from the seal hole 36 into the portion on which the IC chip 14 is mounted and the portion on which the TAB tape 32 is mounted.

Figure 6:
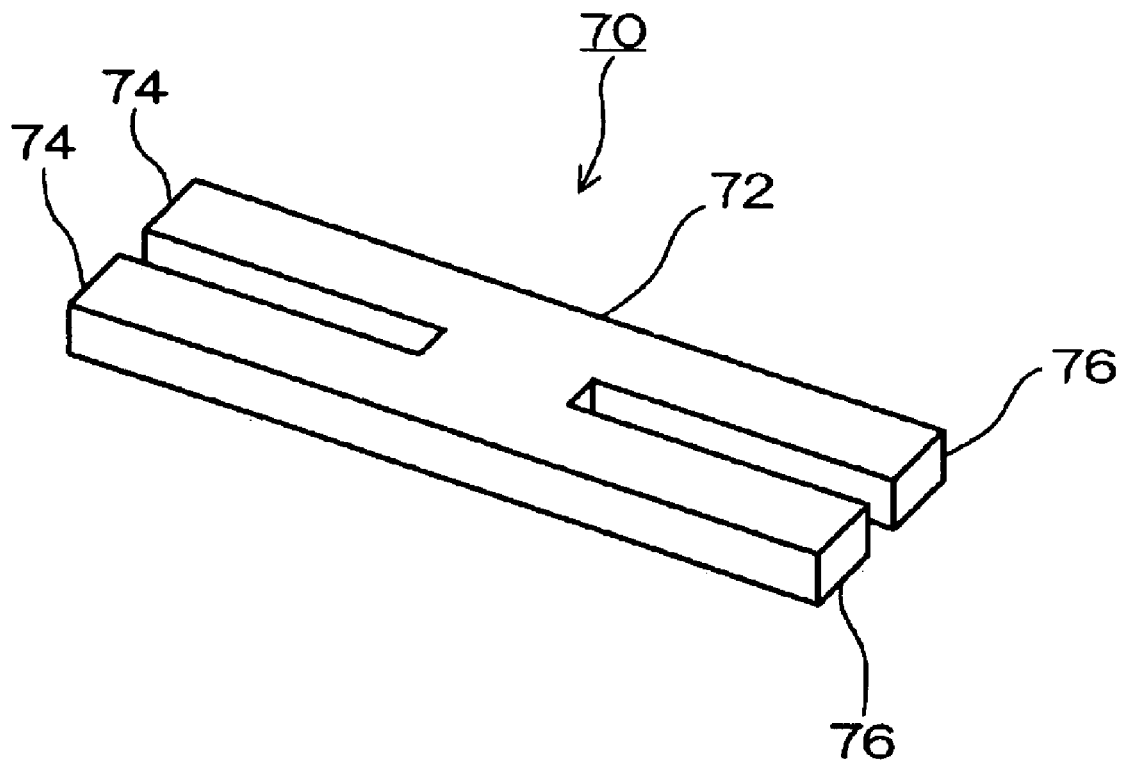
FIG. 6 is an explanatory view of a modified example of the piezoelectric vibrating reed.

The piezoelectric vibrating reed 16 is not limited to the above configuration, but may be formed in the shape shown in FIG. 6. Namely, a piezoelectric vibrating reed 70 can be constructed so that a base portion 72 is provided in its center portion, a pair of drive arms 74 protrude from one side of this base portion 72, and a pair of detection arms 76 protrude from the opposite side to the above side. In FIG. 6, a connection electrode, a drive electrode, and a detection electrode are omitted.

Further, the piezoelectric vibrating reed 16 may be a tuning fork type piezoelectric vibrating reed in which a pair of vibration arms is protruded from a base portion. Further, the piezoelectric vibrating reed 16 may be a piezoelectric vibrating reed such as AT-cut or an elastic surface wave resonance reed and the like. Further, the piezoelectric device 10 is not limited to the gyro sensor, but may be applied to a piezoelectric oscillator or an elastic surface wave oscillator.

Figure 7A:
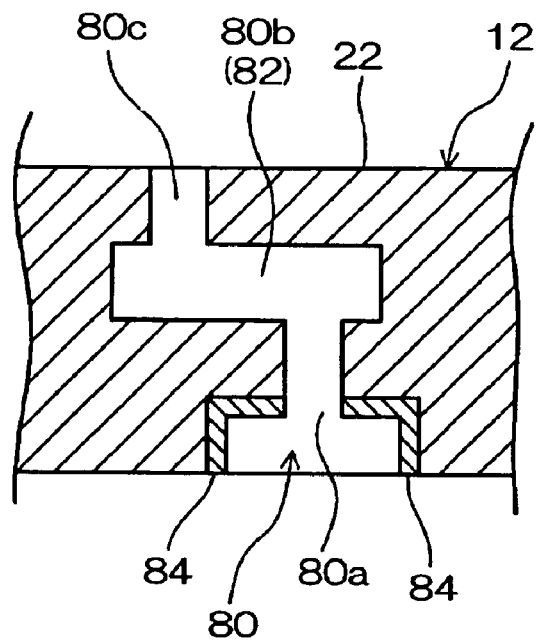
FIG. 7 is an explanatory view of a modified example of the seal hole.
Figure 7B:
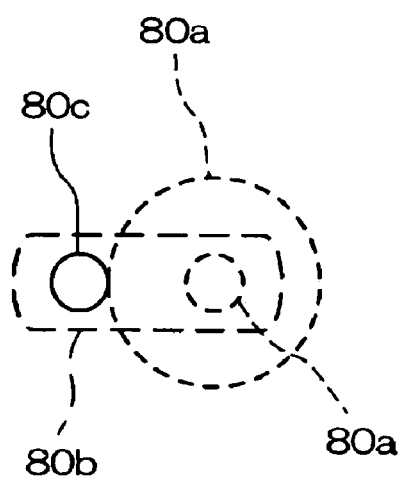
Figure 8:
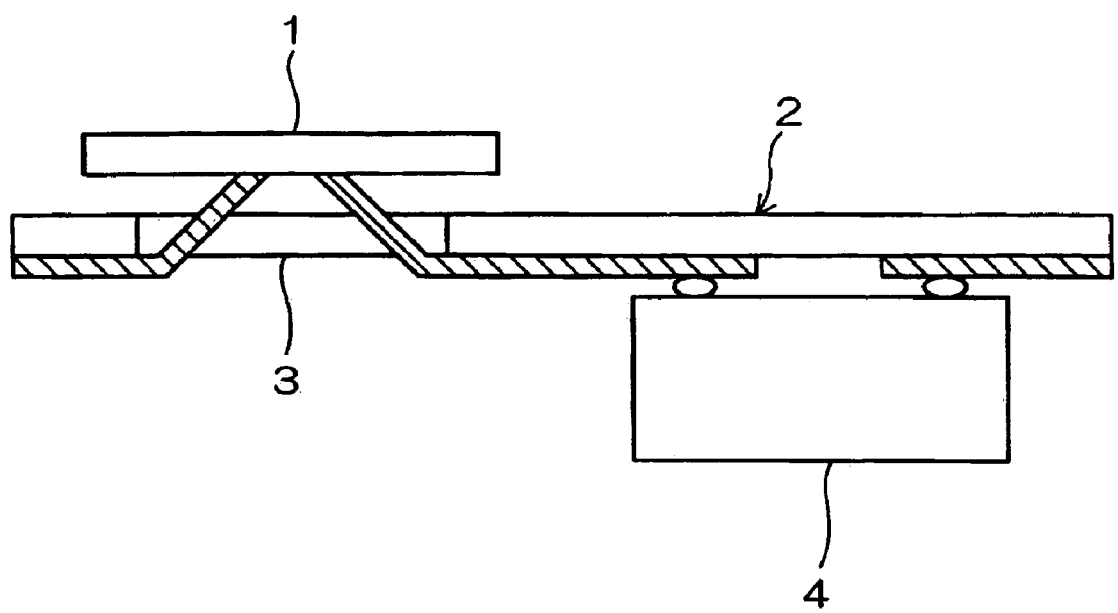
FIG. 8 is an explanatory view when a piezoelectric vibrating reed and an IC chip are mounted on a TAB tape in the related art.
Figure 9A:
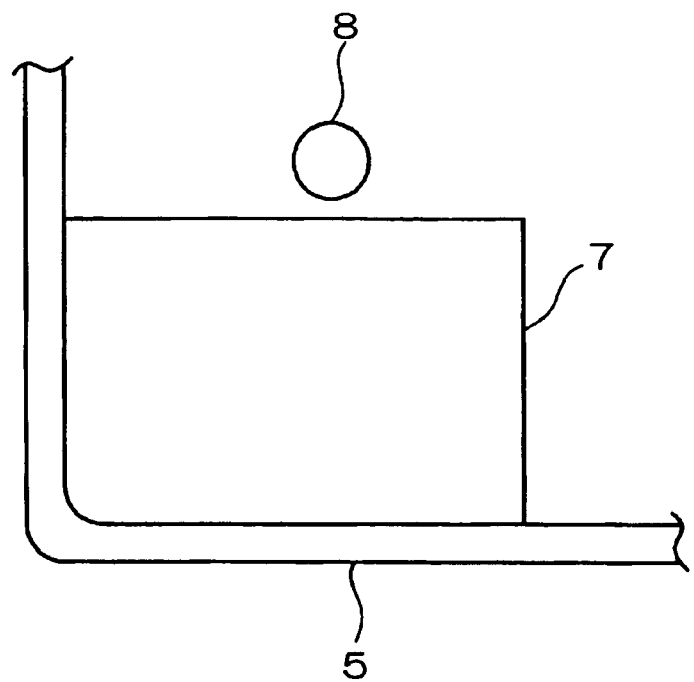
FIG. 9 is an explanatory view of a seal hole provided for a package base in the related art.
Figure 9B:
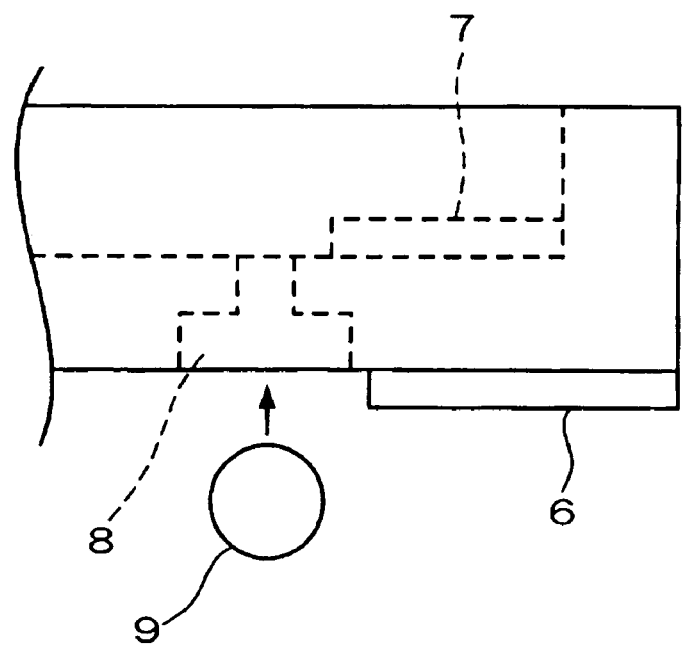

Further, the shape of the seal hole 64 is not limited to the above shape, but may be the shape shown in FIG. 7. Here, FIG. 7(a) is a schematic sectional view of the seal hole, and FIG. 7(b) is a schematic plan view of the seal hole. This seal hole 80 penetrates the package base 12 from the rear surface of the package base 12 to the upper surface of the staircase portion 22 of the package base 12, extends from the rear surface of the package base 12 upward, bends in the horizontal direction on the way, and thereafter extends again upward. A seal hole 80a extending from the rear surface side of the package 12 upward has the two-stage structure, and the hole diameter on the rear surface side is formed wider than the inner hole diameter. Onto the inner wall of the hole located on this rear surface side, a metallization 84 is applied. The upper end of this seal hole 80a opens to a seal hole 80b extending horizontally. This seal hole 80b functions as a bending portion 82. This seal hole 80b is connected to a seal hole 80c extending from the upper surface of the seal hole 80b to the upper surface of the staircase portion 22 of the package base 12. The seal hole 80a on the rear surface side of the package base 12 (outer seal hole located on the outside of the package in relation to the bending portion 82) and the seal hole 80c on the staircase portion 22 side (inner seal hole located on the inside of the package in relation to the bending portion 82) are separate from each other by the desired distance in the horizontal direction. This desired distance is a distance in which the seal hole 80c and the seal hole 80a are not superimposed on each other up and down, that is, a distance in which the seal hole 80a is not seen in the hole of the seal hole 80c when the seal hole 80c is seen from the upside. By such the seal hole 80, even in case that the conductive adhesive is used when the IC chip is joined to the package base 12, this conductive adhesive never flow in the seal hole 80. Further, even if the conductive adhesive applied onto the mount electrode flows into the seal hole 80c, the seal hole 80b extending horizontally prevents the conductive adhesive from directly dropping from the seal hole 80c to the seal hole 80a. Therefore, the rear surface of the IC chip and the metallization 84 of the seal hole 80 do not short, and a recess portion of the package base 12 can be surely sealed air-tightly.

Further, when a sealant provided for the seal hole 80 melts, it is possible to prevent by the seal hole 80b (bending portion 82) the sealant from flowing from the seal hole 80a into the portion on which the IC chip is mounted and the portion on which the TAB tape is mounted.

The invention claimed is:

1. A piezoelectric device comprising:
   a package;
   an IC chip mounted on an inner bottom surface of the package;
   a TAB tape; and
   a piezoelectric vibrating reed electrically and mechanically connected onto the TAB tape in which a lead is provided on a surface thereof;
   wherein the TAB tape to which the piezoelectric vibrating reed has been joined is mounted in the package, the piezoelectric vibrating reed being arranged above the IC chip, and wherein a seal hole through which an inside of the package is air-tightly sealed is provided at the bottom of the package, the seal hole having a bending portion.

2. The piezoelectric device according to claim 1, wherein:
the TAB tape has a device hole in its center, and the lead is protruded inward of the device hole; and
a leading end portion of the lead and a connection electrode provided for the piezoelectric vibrating reed are electrically and mechanically connected.

3. The piezoelectric device according to claim 2, wherein the piezoelectric vibrating reed has, in its center, a base portion on which the connection electrode is formed, and a drive arm and a detection arm for detecting an angular velocity are protruded from the base portion.

4. The piezoelectric device according to claim 1, wherein:
the seal hole includes an outer seal hole located on an outside of the package in relation to the bending portion, and an inner seal hole located on the inside of the package in relation to the bending portion; and
the outer seal hole and the inner seal hole are separate in a horizontal direction.

* * * * *